(12) United States Patent
Huang et al.

(10) Patent No.: US 12,550,380 B2
(45) Date of Patent: Feb. 10, 2026

(54) DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventors: Jiahui Huang, Guangdong (CN); Zhixiong Jiang, Guangdong (CN); Qiang Wang, Guangdong (CN); Cheng Gong, Guangdong (CN); Mingjiue Yu, Guangdong (CN); Zhihui Cai, Guangdong (CN)

(73) Assignee: GUANGZHOU CHINA STAR OPTOELECTRONICS SEMICONDUCTOR DISPLAY TECHNOLOGY CO., LTD., Guangzhou (CN)

( * ) Notice: Subject to any disclaimer, the term of this patent is extended or adjusted under 35 U.S.C. 154(b) by 473 days.

(21) Appl. No.: 18/149,034

(22) Filed: Dec. 30, 2022

(65) Prior Publication Data

US 2024/0128377 A1 Apr. 18, 2024

(30) Foreign Application Priority Data

Oct. 18, 2022 (CN) .......................... 202211272822.6

(51) Int. Cl.
H10D 30/67 (2025.01)
(52) U.S. Cl.
CPC ..... *H10D 30/6756* (2025.01); *H10D 30/6729* (2025.01)

(58) Field of Classification Search
CPC .......... H10D 30/6756; H10D 30/6757; H10D 30/6755; H10D 86/423
See application file for complete search history.

(56) References Cited

U.S. PATENT DOCUMENTS 9,590,111 B2 * 3/2017 Yamazaki .......... H10D 30/6704
12,183,824 B2 * 12/2024 Huang .................. H10D 86/60
(Continued)

FOREIGN PATENT DOCUMENTS

| CN | 114122142 A | 3/2022 |
| CN | 114447083 A | 5/2022 |

(Continued)

OTHER PUBLICATIONS

WO2021/258982 (Year: 2021).*
Chinese Office Action issued in corresponding Chinese Patent Application No. 202211272822.6 dated Nov. 25, 2022, pp. 1-9.

*Primary Examiner* — Vincent Wall
(74) *Attorney, Agent, or Firm* — PV IP PC; Wei Te Chung

(57) ABSTRACT

A display panel includes a gate electrode, a source electrode, a drain electrode, and a metal oxide layer disposed corresponding to the gate electrode. The metal oxide layer includes a lower metal oxide layer and an upper metal oxide layer stacked on the lower metal oxide layer. The lower metal oxide layer includes an indium oxide and a lanthanoid oxide. The upper metal oxide layer is located on a surface of the lower metal oxide layer adjacent to the source electrode and the drain electrode. The source electrode and the drain electrode are connected to the upper metal oxide layer. The upper metal oxide layer includes an indium oxide and a lanthanoid oxide, and the upper metal oxide layer includes polycrystalline phase.

17 Claims, 5 Drawing Sheets

(56) References Cited

U.S. PATENT DOCUMENTS

| | | | |
|---|---|---|---|
| 2011/0240987 A1* | 10/2011 | Lee | H10D 30/6755 |
| | | | 438/156 |
| 2013/0120702 A1* | 5/2013 | Yamazaki | H10D 86/423 |
| | | | 438/30 |
| 2014/0138674 A1* | 5/2014 | Sato | H01L 21/02365 |
| | | | 257/43 |
| 2016/0329433 A1 | 11/2016 | Zhuang et al. | |
| 2023/0015871 A1* | 1/2023 | Huang | H10D 86/423 |
| 2025/0098212 A1* | 3/2025 | Huang | H10D 99/00 |

FOREIGN PATENT DOCUMENTS

| | | |
|---|---|---|
| CN | 216793697 U | 6/2022 |
| WO | 2015074439 A1 | 5/2015 |
| WO | 2022160149 A1 | 8/2022 |

* cited by examiner

DISPLAY PANEL

FIELD OF INVENTION

The present application relates to a field of display technology, and particularly relates to a display panel.

BACKGROUND OF INVENTION

Along with development of display panels towards large sizes and high frame rates, requirements for mobility and stability of thin film transistors of the display panels become higher.

Therefore, a technical problem on how to ensure the stability of the thin film transistors while improving the mobility of the thin film transistors of the display panels needs to be solved urgently at present.

SUMMARY

A purpose of the present application is to provide a display panel to ensure stability of a thin film transistor of the display panel while a mobility of a thin film transistor of the display panel is improved.

The present application provides a display panel including:

a thin film transistor including:

a gate electrode;

a source electrode and a drain electrode; and a metal oxide layer including:

a lower metal oxide layer including an indium oxide and a lanthanoid oxide; and an upper metal oxide layer stacked on the lower metal oxide layer and located on a surface of the lower metal oxide layer adjacent to the source electrode and the drain electrode, wherein both the source electrode and the drain electrode are connected to the upper metal oxide layer, the upper metal oxide layer includes an indium oxide and a lanthanoid oxide, and the upper metal oxide layer includes polycrystalline phase.

The metal oxide layer includes the lower metal oxide layer and the upper metal oxide layer. The lower metal oxide layer includes an indium oxide and a lanthanoid oxide. An ionic radius of lanthanoid is similar to an ionic radius of indium, and lanthanoid hardly affects the overlap of an outer electronic orbit of indium. This is conducive to achieving high mobility for the thin film transistor including the lower metal oxide layer. The upper metal oxide layer includes the polycrystalline phase. The polycrystalline phase has better stability than amorphous phase or microcrystalline phase. This is conducive to improving the stability of the thin film transistor including the upper metal oxide layer.

Furthermore, both the lower metal oxide layer and the upper metal oxide layer include the lanthanoid oxide, and deep-level defects in the lower metal oxide layer and the upper metal oxide layer are reduced because of high breaking bond energy and low electronegativity of the lanthanide. Further, the lanthanoid inhibits oxygen vacancies to reduce concentration of the oxygen vacancies in the lower metal oxide layer. This is conducive to improving light stability of the lower metal oxide layer and the upper metal oxide layer, and further improving the stability of the thin film transistor.

In addition, the thin film transistor is a back channel etched thin film transistor. Both the source electrode and the drain electrode are connected to the upper metal oxide layer. When etching a metal layer by adopting an etching solution to obtain the source electrode and the drain electrode, the polycrystalline phase in the upper metal oxide layer has good corrosion resistance to the etching solution. The upper metal oxide layer protects the lower metal oxide layer, thereby preventing the lower metal oxide layer from being damaged by corrosion, and further improving the stability of the thin film transistor.

DETAILED DESCRIPTION OF EMBODIMENTS

The technical solutions in the embodiments of the present application will be described clearly and completely hereafter with reference to the drawings. Apparently, the described embodiments are only a part of but not all embodiments of the present application. All other embodiments obtained by persons of ordinary skill in the art based on the embodiments of the present application without creative efforts shall fall within the protection scope of the present application.

A display panel provided by an embodiment of the present application may be a liquid crystal display panel. In other embodiments, the display panel may also be an organic light-emitting diode display panel, a quantum dot light-emitting display panel, a micro light-emitting diode display panel, or a mini light-emitting diode display panel.

Figure 1:
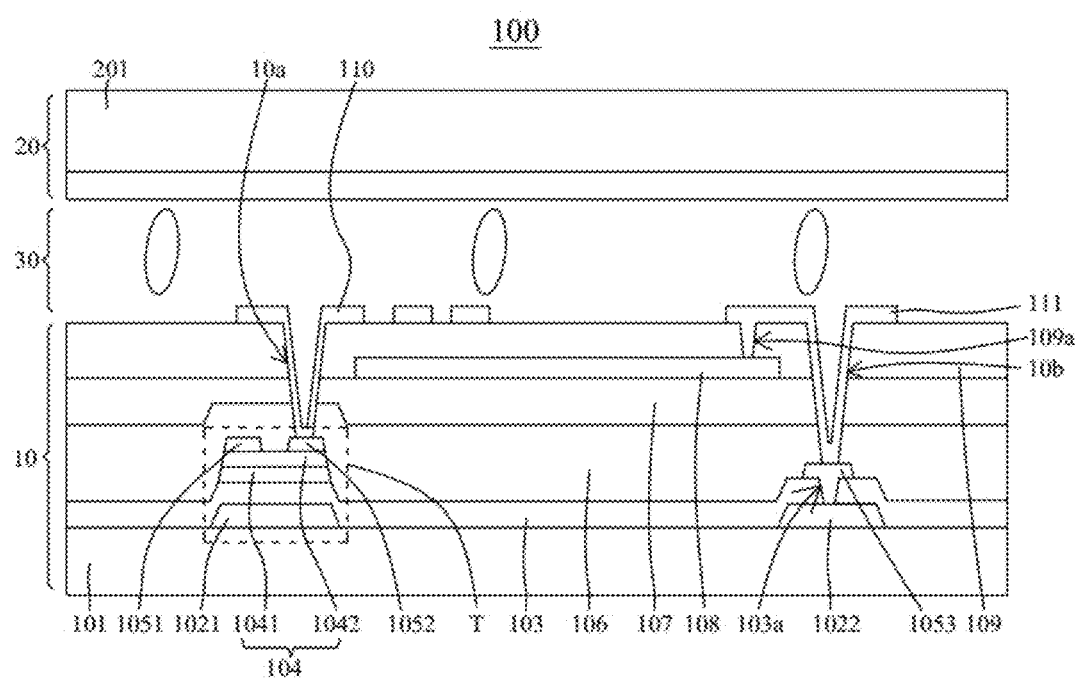
FIG. 1 is a schematic cross-sectional diagram of a display panel in an embodiment of the present application.

Referring to FIG. 1, FIG. 1 is a schematic cross-sectional diagram of a display panel in an embodiment of the present application. The display panel 100 includes an array substrate 10, an opposed substrate 20, and a liquid crystal layer 30 disposed between the array substrate 10 and the opposed substrate 20.

In the embodiment, the array substrate 10 includes a first substrate 101, a gate electrode layer, a gate insulating layer 103, a metal oxide layer 104, a source-drain electrode layer, a first passivation layer 106, a planarization layer 107, a common electrode 108, a second passivation layer 109, and a pixel electrode layer.

In the embodiment, the opposed substrate 20 includes a second substrate 201 and a color filter layer disposed on a surface of the second substrate 201 adjacent to the first substrate 101. The color filter layer includes a red color filter, a blue color filter, a green color filter, and a black matrix.

It may be understood that the opposed substrate 20 can be a substrate without the color filter layer. In this case, the color filter layer may be provided on the array substrate 10.

The first substrate 101 is a glass substrate. The gate electrode layer is disposed on a surface of the first substrate 101. The gate electrode layer includes a gate electrode 1021 and a first connecting part 1022 arranged at intervals in a same layer. A material of the gate electrode layer may include at least one selected from metals, alloys, metal nitrides, conductive metal oxides, transparent conductive materials, etc. For example, the material of the gate electrode layer includes at least one selected from Aurum (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (Nd), iridium (Ir), aluminum alloy, aluminum nitride (AlNx), silver alloy, tungsten (W), tungsten nitride (WNx), copper (Cu) alloy, and molybdenum (Mo) alloy.

The gate insulating layer 103 covers the first substrate 101 and the gate electrode layer. The gate insulating layer 103 defines a first contact hole 103a corresponding to the first connecting part 1022. A material of the gate insulating layer 103 includes an inorganic insulating material, for example, the material of the gate insulating layer 103 includes at least one selected from silicon nitride, silicon oxide, silicon nitride, and aluminum oxide.

The metal oxide layer 104 is disposed on the gate insulating layer 103 and corresponds to the gate electrode 1021. A material of the metal oxide layer 104 includes a metal oxide material.

The source-drain electrode layer includes a source electrode 1051, a drain electrode 1052, and a second connecting part 1053 arranged at intervals in a same layer. The source electrode 1051 and the drain electrode 1052 are disposed on a surface of the metal oxide layer 104 away from the gate electrode 1021. The second connecting part 1053 is disposed on the gate insulating layer 103 and corresponds to the first connecting part 1022, and the second connecting part 1053 is in contact with the first connecting part 1022 through the first contact hole 103a defined in the gate insulating layer 103. A material of the source-drain electrode layer includes a conductive material, such as molybdenum (Mo), copper (Cu), aluminum (Al), and titanium (Ti).

It should be noted that the array substrate 10 includes a thin film transistor T, and the thin film transistor T includes the gate electrode 1021, the source electrode 1051, the drain electrode 1052, a lower metal oxide layer 1041, and an upper metal oxide layer 1042.

The first passivation layer 106 covers the source-drain electrode layer and the gate insulating layer 103. A material of the first passivation layer 106 includes an inorganic insulating material. For example, the material of the first passivation layer 106 includes at least one selected from silicon nitride, silicon oxide, silicon oxynitride, and aluminum oxide.

The planarization layer 107 covers the first passivation layer 106. A material of the planarization layer 107 includes an organic insulating material. For example, the material of the planarization layer 107 includes at least one selected from polyimide and polyacrylate.

The common electrode 108 is disposed on the planarization layer 107. A material of the common electrode 108 includes a transparent conductive material. For example, the transparent conductive material includes indium tin oxide or indium zinc oxide.

The second passivation layer 109 covers the common electrode 108 and the planarization layer 107. The second passivation layer 109 defines a second contact hole 109a corresponding to the common electrode 108. A material of the second passivation layer 109 includes an inorganic insulating material, for example, the material of the second passivation layer 109 includes at least one selected from silicon nitride, silicon oxide, silicon oxynitride, and aluminum oxide.

The array substrate 10 further provides with a third contact hole 10a and a fourth contact hole 10b. Both the third contact hole 10a and the fourth contact hole 10b go through the second passivation layer 109, the planarization layer 107, and the first passivation layer 106. The third contact hole 10a corresponds to the drain electrode 1052, and the fourth contact hole 10b corresponds to the second connecting part 1053.

The pixel electrode layer includes a pixel electrode 110 and a bridging part 111 arranged at intervals in a same layer. The bridging part 111 overlaps the common electrode 108 and the second connecting part 1053. The pixel electrode 110 overlaps the drain electrode 1052. The pixel electrode 110 is provided with slits. The pixel electrode 110 is in contact with the drain electrode 1052 through the third contact hole 10a. The bridging part 111 is in contact with the second connecting part 1053 through the fourth contact hole 10b. The bridging part 111 is in contact with the common electrode 108 through the second contact hole 109a. A material of the pixel electrode layer includes a transparent conductive material, such as indium tin oxide and indium zinc oxide.

In the embodiment, as shown in FIG. 1, the metal oxide layer 104 includes the lower metal oxide layer 1041 and the upper metal oxide layer 1042. The upper metal oxide layer 1042 is stacked on the lower metal oxide layer 1041. The upper metal oxide layer 1042 is located on a surface of the lower metal oxide layer 1041 adjacent to the source electrode 1051 and the drain electrode 1052. Both the source electrode 1051 and the drain electrode 1052 are connected with the upper metal oxide layer 1042.

Both the upper metal oxide layer 1042 and the lower metal oxide layer 1041 include an indium oxide $In_2O_3$ and a lanthanoid oxide LnO.

The indium oxide $In_2O_3$ is an n-type semiconductor with a stable cubic ferromanganese structure. Concentration of intrinsic carriers of the indium oxide $In_2O_3$ is up to $10^{20}$ cm$^{-3}$, and the indium oxide $In_2O_3$ is also easy to crystallize.

Lanthanoid series include a total of 15 metal elements, namely lanthanum (La), cerium (Ce), praseodymium (Pr), neodymium (Nd), promethium (Pin), samarium (Sin), europium (Eu), gadolinium (Gd), terbium (Tb), dysprosium (Dy), holmium (Ho), erbium (Er), thulium (Tin), ytterbium (Yb), and lutetium (Lu).

It should be noted that an ion orbital radius of Ga is much less than an ion orbital radius of In. Overlap of outer electronic orbits of In is decreased by doping Ga in the metal oxide layer 104. Thereby mobility of the metal oxide layer 104 is reduced. Ionic orbit radius of the lanthanoid is similar to an ionic orbit radius of In. The lanthanoid hardly affects the overlap of the outer electronic orbit of In. This is conducive to ensuring that the lower metal oxide layer 104 including the lanthanoid oxide and the indium oxide has high mobility. Furthermore, the lanthanoid oxide is oxide with high breaking bond energy. The lanthanoid has low electronegativity. This is conducive to reducing deep-level defects in the metal oxide layer and improving light stability of the lower metal oxide layer including the lanthanoid oxide.

In the embodiment, the lower metal oxide layer 1041 is taken as an active layer. The lower metal oxide layer 1041 is an amorphous metal oxide layer. The amorphous phase makes carriers transport in the lower metal oxide layer 1041 more easier, and thereby ensures high mobility of the lower metal oxide layer 1041.

It should be noted that providing the lower metal oxide layer 1041 includes following steps: taking a first metal oxide target material including the indium oxide $In_2O_3$ and the lanthanoid oxide LnO as a raw material, depositing the first metal oxide target material by magnetron sputtering to obtain a first metal oxide film, and patterning the first metal oxide film to obtain the lower metal oxide layer 1041.

It may be understood that the lower metal oxide layer 1041 may also include crystalline phase. The lower metal oxide layer 1041 including the crystalline phase may lose semiconductor characteristics and have conductor characteristics.

In the embodiment, the upper metal oxide layer 1042 is taken as a protective layer of the lower metal oxide layer 1041. The upper metal oxide layer 1042 includes polycrystalline phase. The polycrystalline phase has better stability than the amorphous phase or the microcrystalline phase. The polycrystalline phase has good corrosion resistance to an etching solution for wet etching to form the source electrode and the drain electrode, and thereby preventing the lower metal oxide layer 1041 from being corroded and damaged by the etching solution.

It should be noted that the polycrystalline phase is in a steady state. The polycrystalline phase includes a plurality of crystalline grains, and a grain boundary is located between two adjacent crystalline grains. However, the microcrystalline phase is in a metastable state. The amorphous phase is in an amorphous state. The polycrystalline phase is more stable than the microcrystalline phase or the amorphous phase. Therefore, the upper metal oxide layer 1042 including the polycrystalline phase has better stability than the metal oxide layer including the amorphous phase or the microcrystalline phase.

It should be further noted that providing the upper metal oxide layer 1042 includes following steps: taking a second metal oxide target material including the indium oxide $In_2O_3$ and the lanthanoid oxide LnO as a raw material, depositing the second metal oxide target material by magnetron sputtering to obtain a second metal oxide film, patterning the second metal oxide film, and laser annealing or heating annealing the second metal oxide film to obtain the upper metal oxide layer 1042. A heating temperature of crystallization by heating and annealing is greater than or equal to 250 Celsius degrees and less than or equal to 450 Celsius degrees.

In the embodiment, in the lower metal oxide layer 1041, a quantity of indium atoms is In1, and a quantity of lanthanoid atoms is Ln1. In the upper metal oxide layer 1042, a quantity of the indium atoms is In2, and a quantity of the lanthanoid atoms is Ln2. Wherein $In2/(In2+Ln2)>In1/(In1+Ln1)$. In other words, in the upper metal oxide layer 1042, a ratio of the quantity of indium atoms to a sum of the quantity of indium atoms and the quantity of lanthanoid atoms is $In2/(In2+Ln2)$. In the lower metal oxide layer 1041, a ratio of the quantity of indium atoms to a sum of the quantity of indium atoms and the quantity of lanthanoid atoms is $In1/(In1+Ln1)$. The ratio $In2/(In2+Ln2)$ is greater than the ratio $In1/(In1+Ln1)$.

In the thin film transistor T of the display panel of the present application, both the upper metal oxide layer 1042 and the lower metal oxide layer 1041 include the lanthanoid oxide and the indium oxide. The quantity of indium atoms in the upper metal oxide layer 1042 is greater than the quantity of indium atoms in the lower metal oxide layer 1041, so that the upper metal oxide layer 1042 is easier to form the polycrystalline phase after the crystallization treatment. Furthermore, the lower metal oxide layer 1041 is easier to maintain the amorphous phase during the crystallization treatment of the upper metal oxide layer 1042.

In the embodiment, in the upper metal oxide layer 1042, $0.8 \leq In2/(In2+Ln2)<1$, so that the upper metal oxide layer 1042 includes more indium oxide, a crystallization temperature required for the crystallization treatment to obtain the upper metal oxide layer 1042 is lower, and the upper metal oxide layer 1042 is easier to form the polycrystalline phase, thereby the stability of the upper metal oxide layer 1042 is improved and the corrosion resistance to the etching solution, and the stability of the thin film transistor T is further improved.

In the upper metal oxide layer 1042, $In2/(In2+Ln2) \leq 0.95$, which prevents that the upper metal oxide layer 1042 includes too much indium oxide. This results that etching the second metal oxide film including too much indium oxide is difficult, thereby manufacturing the upper metal oxide layer 1042 is difficult.

It may be understood that in the upper metal oxide layer 1042, $0.85 \leq In2/(In2+Ln2) \leq 0.98$, or, $0.88 \leq In2/(In2+Ln2) \leq 0.96$, or $0.90 \leq In2/(In2+Ln2) \leq 0.94$. For example, the $In2/(In2+Ln2)$ may be 0.82, 0.85, 0.88, 0.9, 0.92, 0.93, or 0.95.

In the upper metal oxide layer 1042, $0.01 \leq In2/(In2+Ln2) \leq 0.2$. An atomic proportion of the lanthanoid in the upper metal oxide layer 1042 is greater than 0.2, which may adversely affect a formation of the polycrystalline phase of the indium oxide. The indium oxide is a main component in the upper metal oxide layer 1042. The atomic proportion of the lanthanides in the upper metal oxide layer 1042 is less than 0.01. This is not conducive to ensuring the light stability of the upper metal oxide layer 1042.

It may be understood that in the upper metal oxide layer 1042, $0.02 \leq In2/(In2+Ln2) \leq 0.1$, or, $0.03 \leq In2/(In2+Ln2) \leq 0.07$, or $0.04 \leq In2/(In2+Ln2) \leq 0.065$. For example, the $In2/(In2+Ln2)$ may be 0.01, 0.025, 0.03, 0.05, 0.07, 0.09, 0.1, 0.12, 0.15, or 0.2.

In the upper metal oxide layer 1042, the upper metal oxide layer 1042 further includes a tin oxide $SnO_2$, a quantity of tin atoms is Sn, $Sn/(In2+Ln2+Sn)<Ln2/(In2+Ln2+Sn)$. In other words, the quantity of tin atoms in the upper metal oxide layer 1042 is less than the quantity of lanthanoid atoms in the upper metal oxide layer 1042.

For the thin film transistor T of the display panel in the embodiment, the upper metal oxide layer 1042 includes the tin oxide. A crystallization temperature of the tin oxide is lower than a crystallization temperature of the indium oxide, so that the upper metal oxide layer 1042 is easy to form the polycrystalline phase after the crystallization treatment. The quantity of tin atoms in the upper metal oxide layer 1042 is less than the quantity of lanthanoid atoms in the upper metal oxide layer 1042, so as to prevent that in the upper metal oxide layer 1042 includes too much tin, which results that etching the second metal oxide film including too much tin oxide is difficult, thereby manufacturing the upper metal oxide layer 1042 is difficult.

In the upper metal oxide layer 1042, $0.01 \leq Sn/(Sn+In2+Ln2) \leq 0.05$. It may be understood that, $0.02 \leq Sn/(Sn+In2+Ln2) \leq 0.04$ or $0.03 \leq Sn/(Sn+In2+Ln2) \leq 0.045$. For example, the $Sn/(Sn+In2+Ln2)$ is 0.01, 0.02, 0.03, 0.04, or 0.05.

Figure 2:
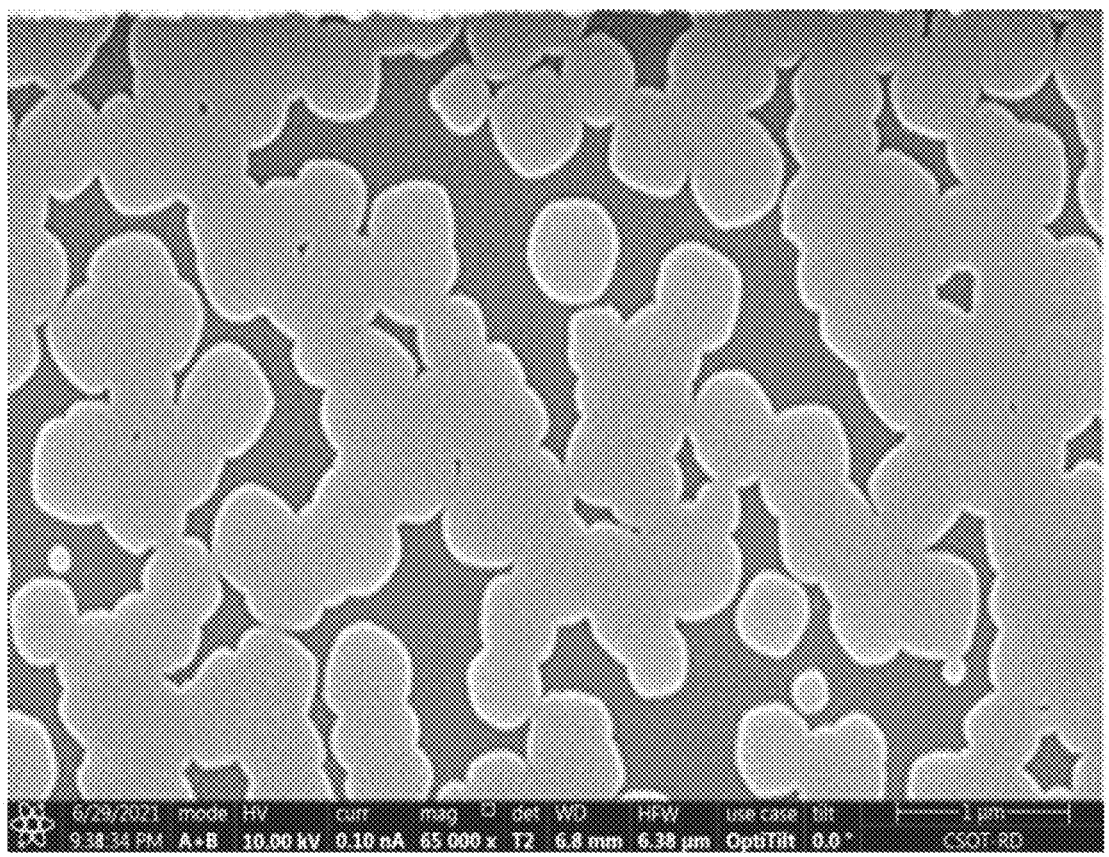
FIG. 2 is an SEM diagram of a second metal oxide film after being etched, wherein $Sn1/(Sn1+In21+Ln21)$ in the second metal oxide film composed of tin oxide, indium oxide, and lanthanoid oxide LnO is 0.1.
Figure 3:
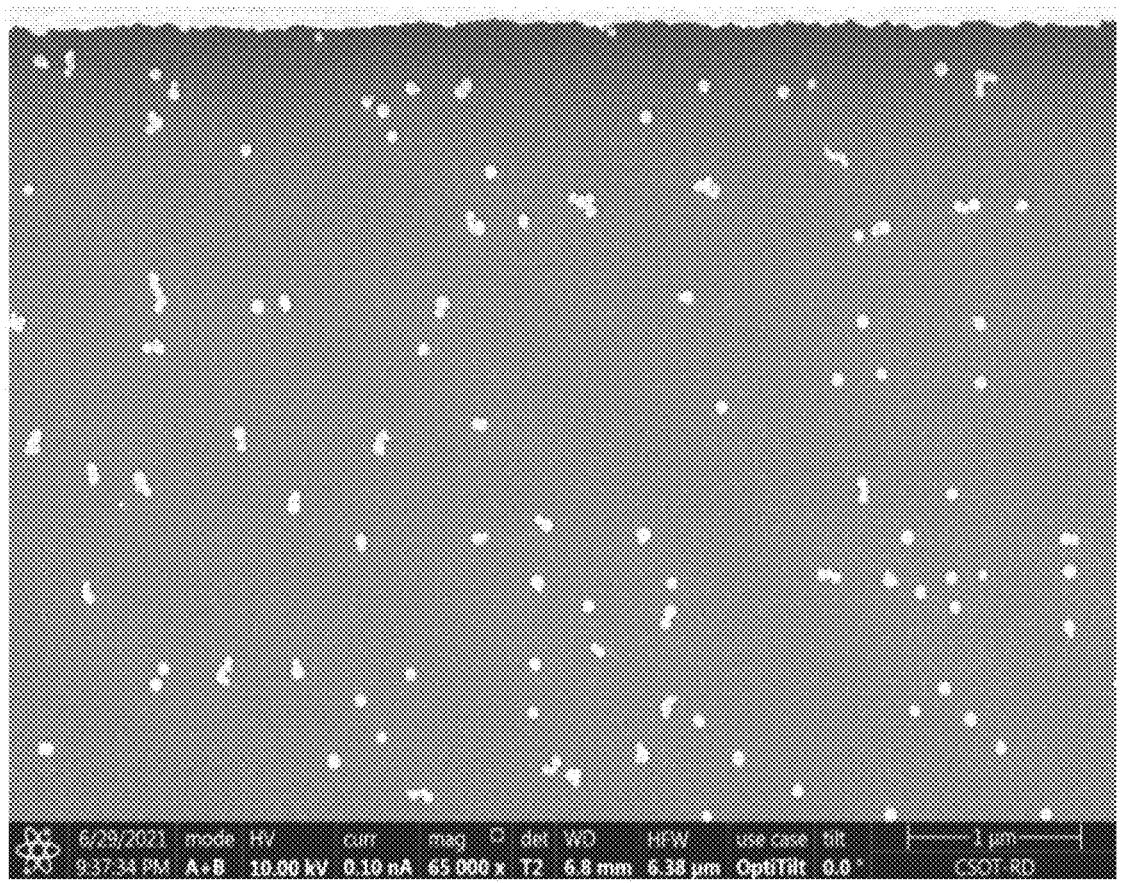
FIG. 3 is an SEM diagram of the second metal oxide film after being etched, wherein the $Sn1/(Sn1+In21+Ln21)$ in the second metal oxide film composed of the tin oxide, the indium oxide, and the lanthanoid oxide LnO is 0.05.
Figure 4:
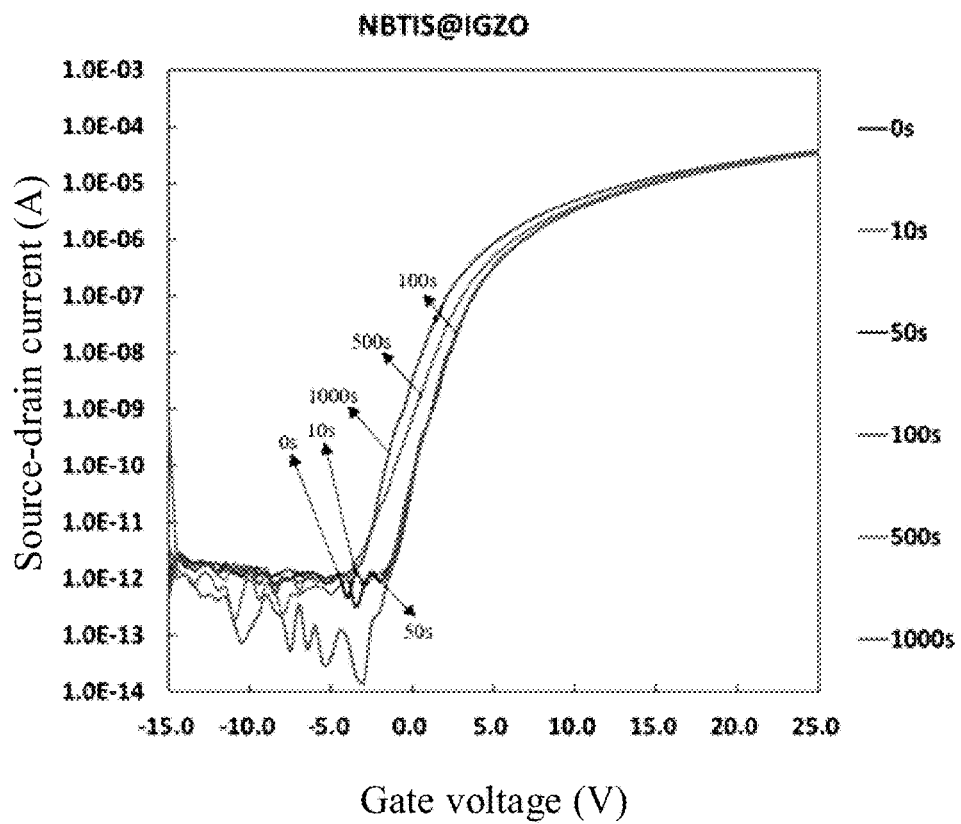
FIG. 4 are transferred characteristic curves under negative gate bias and illumination stress of a thin film transistor with an active layer being an indium gallium zinc oxide layer in Table 1.

As shown in FIG. 2 and FIG. 3, FIG. 2 is an SEM diagram of a second metal oxide film after being etched, wherein $Sn1/(Sn1+In21+Ln21)$ in the second metal oxide film composed of tin oxide, indium oxide, and lanthanoid oxide LnO is 0.1. FIG. 3 is an SEM diagram of the second metal oxide film after being etched, wherein the $Sn1/(Sn1+In21+Ln21)$ in the second metal oxide film composed of the tin oxide, the indium oxide, and the lanthanoid oxide LnO is 0.05. Sn1 is a quantity of tin atoms in the second metal oxide film, In21 is a quantity of indium atoms in the second metal oxide film, and Ln21 is a quantity of lanthanoid atoms in the second metal oxide film.

Combined with FIG. 2, when the $Sn1/(Sn1+In21+Ln21)$ in the second metal oxide film is 0.1, the second metal oxide film after being etched has a large amount of residue appears. Referring to FIG. 3, when the $Sn1/(Sn1+In21+Ln21)$ in the second metal oxide film is 0.05, the second metal oxide film after being etched has a slight residue.

In the upper metal oxide layer 1042, the upper metal oxide layer 1042 further includes a zinc oxide, a quantity of zinc atoms is Zn2, and $0.01 \leq Zn2/(Sn+In2+Ln2+Zn2) \leq 0.2$. When the $Zn2/(Sn+In2+Ln2+Zn2)$ is greater than 0.2, which may adversely affect the formation of the polycrystalline phase of the indium oxide. The indium oxide is the main component in the upper metal oxide layer 1042. The zinc oxide is a stable tetrahedral structure, and the $Zn2/(Sn+In2+Ln2+Zn2)$ is less than 0.01. This is not conducive to the stability of the upper metal oxide layer 1042.

It may be understood that, $0.015 \leq Zn2/(Sn+In2+Ln2+Zn2) \leq 0.1$, or, $0.02 \leq Zn2/(Sn+In2+Ln2+Zn2) \leq 0.06$, or $0.03 \leq Zn2/(Sn+In2+Ln2+Zn2) \leq 0.5$. For example, the $Zn2/(Sn+In2+Ln2+Zn2)$ is 0.01, 0.02, 0.04, 0.05, or 0.08.

A thickness of the upper metal oxide layer 1042 is greater than or equal to 100 angstroms and is less than or equal to 200 angstroms. The thickness of the upper metal oxide layer 1042 is less than 100 angstroms, so that manufacturing the upper metal oxide layer 1042 is too difficult to realize mass production. The thickness of the upper metal oxide layer 1042 is greater than 200 angstroms, so that the upper metal oxide layer 1042 easily has conductive characteristics. For example, the thickness of the upper metal oxide layer 1042 is 100 angstroms, 120 angstroms, 150 angstroms, 160 angstroms, 180 angstroms, or 200 angstroms.

In the embodiment, in the lower metal oxide layer 1041, $0.5 \leq In1/(In1+Ln1) \leq 0.9$. The $In1/(In1+Ln1)$ is greater than 0.9. This is not conducive to a formation of the amorphous phase of the lower metal oxide layer 1041. The $In1/(In1+Ln1)$ is less than 0.5. This is not conducive to ensuring high mobility of the lower metal oxide layer 1041.

It may be understood that in the lower metal oxide layer 1041, $0.5 \leq In1/(In1+Ln1) \leq 0.8$, or, $0.55 \leq In1/(In1+Ln1) \leq 0.75$, or, $0.6 \leq In1/(In1+Ln1) \leq 0.7$, or $0.65 \leq In1/(In1+Ln1) \leq 0.7$. For example, the $In1/(In1+Ln1)$ is 0.52, 0.55, 0.58, 0.6, 0.62, 0.65, 0.7, 0.75, 0.8, 0.85, or 0.9.

In the lower metal oxide layer 1041, $0.01 \leq Ln1/(In1+Ln1) \leq 0.5$. The $Ln1/(In1+Ln1)$ is greater than 0.5, the lanthanoid is excessive, which may adversely affect the mobility of the lower metal oxide layer 1041. The $Ln1/(In1+Ln1)$ is less than 0.01, the lanthanoid is too few, which is not conducive to improving the light stability of the lower metal oxide layer 1041.

It may be understood that, $0.02 \leq Ln1/(In1+Ln1) \leq 0.2$, or, $0.04 \leq Ln1/(In1+Ln1) \leq 0.16$, $0.08 \leq Ln1/(In1+Ln1) \leq 0.12$. For example, the $Ln1/(In1+Ln1)$ is 0.01, 0.03, 0.05, 0.07, 0.09, 0.1, 0.12, 0.14, or 0.16.

In the lower metal oxide layer 1041, the lower metal oxide layer 1041 includes the zinc oxide ZnO, a quantity of zinc atoms is Zn1, and $0.05 \leq Zn1/(In1+Ln1+Zn1) \leq 0.5$. The $Zn1/(In1+Ln1+Zn1)$ is greater than 0.5, which is not conducive to the mobility of the lower metal oxide layer 1041. The zinc oxide is a stable tetrahedral structure. This is conducive to the formation of stable amorphous phase in the lower metal oxide layer 1041. The $Zn1/(In1+Ln1+Zn1)$ is less than 0.05. This is not conducive to the formation of stable amorphous phase in the lower metal oxide layer 1041.

It may be understood that, $0.08 \leq Zn1/(In1+Ln1+Zn1) \leq 0.4$, or, $0.12 \leq Zn1/(In1+Ln1+Zn1) \leq 0.35$, or, $0.14 \leq Zn1/(In1+Ln1+Zn1) \leq 0.3$, or $0.2 \leq Zn1/(In1+Ln1+Zn1) \leq 0.25$. For example, The $Zn1/(In1+Ln1+Zn1)$ is 0.08, 0.1, 0.12, 0.15, 0.2, 0.3, or 0.45.

A thickness of the lower metal oxide layer 1041 is great than or equal to 100 angstroms and is less than or equal to 200 angstroms. The thickness of the lower metal oxide layer 1041 is less than 100 angstroms, so that manufacturing the lower metal oxide layer 1041 is too difficult to realize mass production. The thickness of the lower metal oxide layer 1041 is great than 200 angstroms, so that the lower metal oxide layer 1041 easily has conductive characteristics. This is not conducive to using the lower metal oxide layer 1041 as the active layer. For example, the thickness of the lower metal oxide layer 1041 is 100 angstroms, 120 angstroms, 150 angstroms, 160 angstroms, 180 angstroms, or 200 angstroms.

Table 1 below shows mobilities of the thin film transistor when the active layer of the thin film transistor are the lower metal oxide layers 1-4 and the indium gallium zinc oxide layer, respectively. The quantity of indium atoms in the lower metal oxide layer is In1. The quantity of zinc atoms in the lower metal oxide layer is Zn1. Pr, La, and Yb are atomic proportions in the lower metal oxide layer. In is an atomic proportion of indium atoms in the indium gallium zinc oxide layer. Zn is an atomic proportion of zinc atoms in the indium gallium zinc oxide layer. Ga is an atomic proportion of gallium in the indium gallium zinc oxide layer.

TABLE 1

| active layer | compositions | mobilities(cm$^2$/Vs) |
|---|---|---|
| lower metal oxide layer 1 | In1:Zn1:La = 0.5:0.4:0.1 | 20 |
| lower metal oxide layer 2 | In1:Zn1:Pr = 0.9:0.05:0.05 | 28 |
| lower metal oxide layer 3 | In1:Zn1:Yb = 0.7:0.29:0.01 | 35 |
| lower metal oxide layer 4 | In1:Zn1:La = 0.34:0.33:0.33 | 15 |
| indium gallium zinc oxide layer | In:Zn:Ga = 0.34:0.33:0.33 | 8 |

Combined with Table 1, when metal elements of the metal oxide layer are composed of indium, zinc, and lanthanide, the mobility of the thin film transistor is as high as 15 cm$^2$/Vs-35 cm$^2$/Vs, which is higher than the mobility of the thin film transistor including the indium gallium zinc oxide layer. Furthermore, according to the mobilities corresponding to the lower metal oxide layers 1-4, it may be seen that the atomic proportion of indium atoms is too low, and the atomic proportion of lanthanoid atoms is too high. This is not conducive to improving the mobility of thin film transistor.

Figure 5:
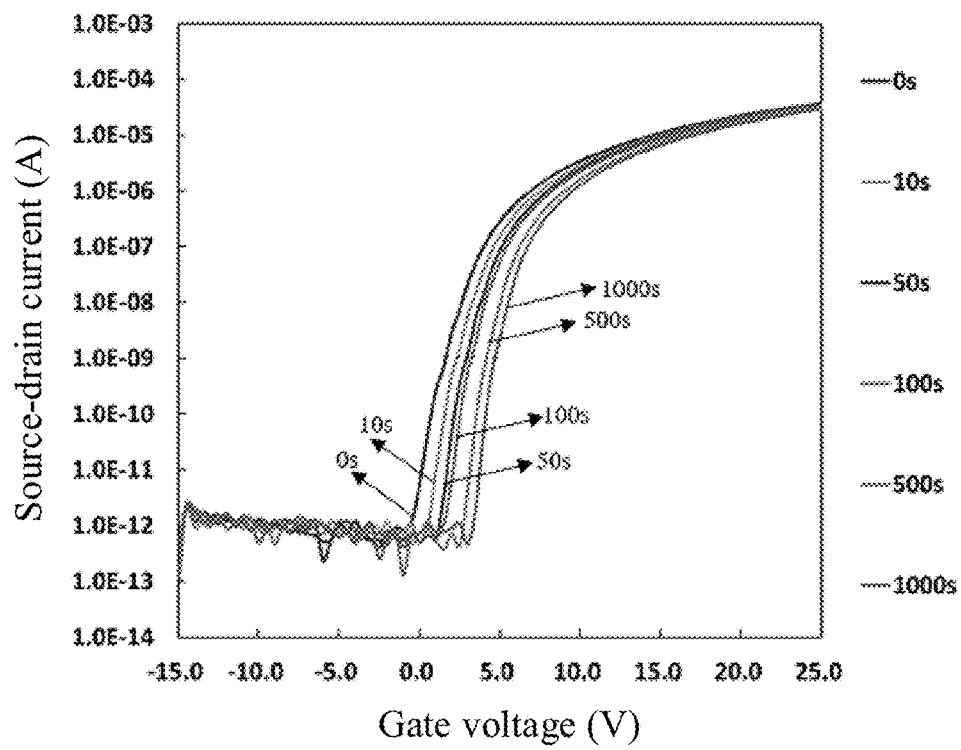
FIG. 5 are transferred characteristic curves under positive gate bias stress of the thin film transistor with the active layer being the indium gallium zinc oxide layer in Table 1.
Figure 6:
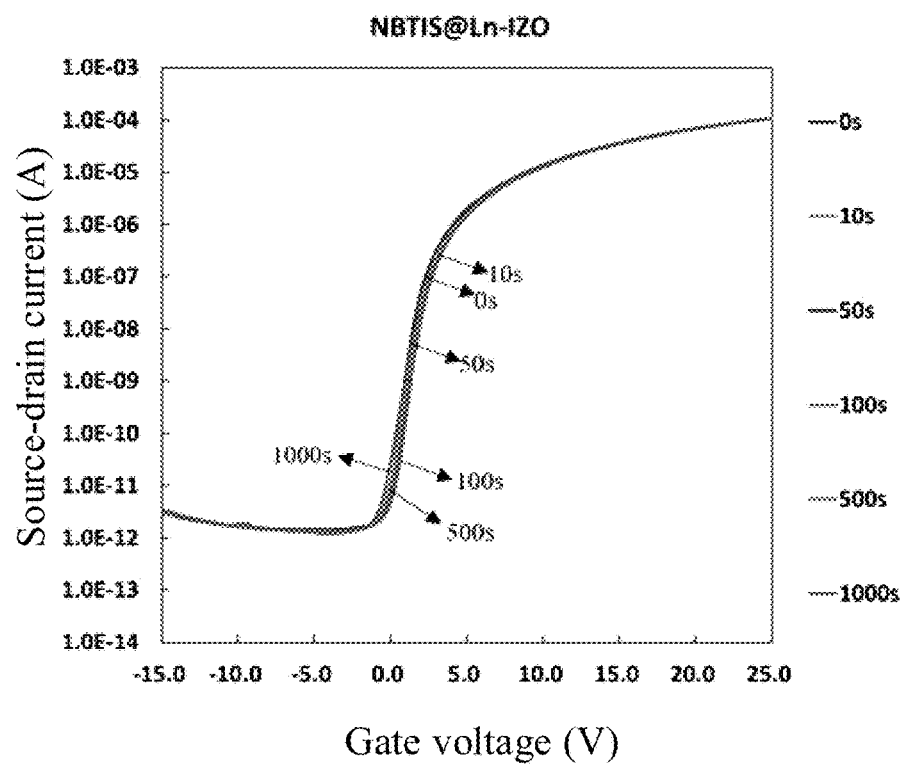
FIG. 6 are transferred characteristic curves under negative gate bias and illumination stress of the thin film transistor with the active layer being a metal oxide layer 3 in Table 1.
Figure 7:
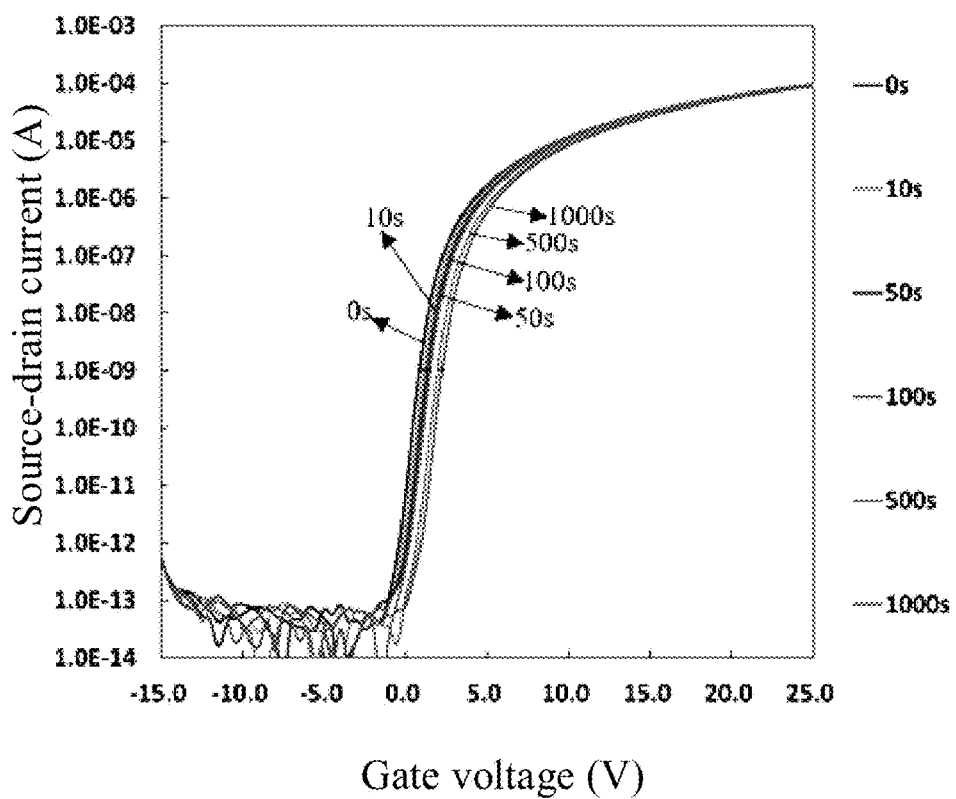
FIG. 7 are transferred characteristic curves under positive gate bias stress of the thin film transistor with the active layer being the metal oxide layer 3 in Table 1.

As shown in FIG. 4 to FIG. 7, FIG. 4 are transferred characteristic curves under negative gate bias and illumination stress of a thin film transistor with an active layer being an indium gallium zinc oxide layer in Table 1. FIG. 5 are transferred characteristic curves under positive gate bias stress of the thin film transistor with the active layer being the indium gallium zinc oxide layer in Table 1. FIG. 6 are transferred characteristic curves under negative gate bias and illumination stress of the thin film transistor with the active layer being a metal oxide layer 3 in Table 1. FIG. 7 are transferred characteristic curves under positive gate bias stress of the thin film transistor with the active layer being the metal oxide layer 3 in Table 1. Table 2 below shows threshold voltage offsets of the transferred characteristic curves in FIG. 4 to FIG. 7.

TABLE 2

| threshold voltage offsets/V | indium gallium zinc oxide layer | lower metal oxide layer 3 |
|---|---|---|
| NBIS | −1.71 V | −0.18 V |
| PBS | +3.08 V | +1.4 V |

Combined with Table 2, under negative gate bias illumination stress, an offset value of the threshold voltage of the thin film transistor including the lower metal oxide layer 3 in Table 1 is less than an offset value of the threshold voltage of the thin film transistor including the indium gallium zinc oxide layer in Table 1. Under positive gate bias stress, an offset value of the threshold voltage of the thin film transistor including the lower metal oxide layer 3 is also less than an offset value of the threshold voltage of the thin film transistor including the indium gallium zinc oxide layer in Table 1. Therefore, in the display panel of the present application, the lower metal oxide layer of the thin film transistor has better stability.

It should be noted that when the display panel is an organic light-emitting diode display panel, a quantum dot light-emitting display panel, a micro light-emitting diode display panel, or a mini emitting-diode display panel. The display panel includes the array substrate and a light-emitting device disposed on the array substrate. The array substrate includes a substrate and a driving circuit layer disposed on the substrate. The driving circuit layer includes a plurality of the thin film transistors mentioned above. The light-emitting device is connected with at least one of the thin film transistors.

In a case that the display panel of the present application is the organic light-emitting diode display panel, the display panel includes the array substrate, an organic light-emitting device, and an encapsulation layer. The organic light-emitting device and the encapsulation layer are disposed on the array substrate. The array substrate includes the thin film transistors mentioned above. The organic light-emitting device is connected with at least one of the thin film transistors mentioned above.

In a case that the display panel of the present application is the micro light-emitting diode display panel or the mini emitting-diode display panel, the display panel includes the array substrate, an inorganic emitting-diode device (a micro light-emitting diode device or a mini light-emitting diode device). The encapsulation layer, the inorganic emitting-diode device, and the encapsulation layer are disposed on the array substrate. The array substrate includes the thin film transistors mentioned above. The inorganic emitting-diode device is connected with at least one of the thin film transistors mentioned above.

In a case that the display panel of the present application is the quantum dot light-emitting display panel, the display panel includes the array substrate, a blue light-emitting device, and a quantum dot light conversion layer. The blue light-emitting device and the quantum dot light conversion layer are disposed on the array substrate. Or, the display panel includes the array substrate and a quantum dot light-emitting layer. The array substrate includes the thin film transistors mentioned above. The blue light-emitting device or the quantum dot light conversion layer is connected with at least one of the thin film transistors mentioned above.

The description about the foregoing embodiments is merely provided to help understand the method and core ideas of the present application. Persons of ordinary skill in the art should understand that they may still make modifications to the technical solutions described in the foregoing embodiments or make equivalent replacements to some or all technical features thereof, without departing from the scope of the technical solutions of the embodiments of the present application.

What is claimed is:

1. A display panel, comprising:
a thin film transistor comprising:
a gate electrode;
a source electrode and a drain electrode; and
a metal oxide layer disposed corresponding to the gate electrode, comprising:
a lower metal oxide layer comprising an indium oxide and a lanthanoid oxide; and
an upper metal oxide layer stacked on the lower metal oxide layer and located on a surface of the lower metal oxide layer adjacent to the source electrode and the drain electrode, wherein both the source electrode and the drain electrode are connected to the upper metal oxide layer, the upper metal oxide layer comprises a indium oxide and a lanthanoid oxide, and the upper metal oxide layer comprises polycrystalline phase;
wherein in the lower metal oxide layer, a quantity of indium atoms is $In1$, and a quantity of lanthanoid atoms is $Ln1$, and in the upper metal oxide layer, a quantity of indium atoms is $In2$, and a quantity of lanthanoid atoms is $Ln2$,
wherein $In2/(In2+Ln2) > In1/(In1+Ln1)$, $0.5 \leq In1/(In1+Ln1) \leq 0.9$.

2. The display panel in claim 1, wherein $0.8 \leq In2/(In2+Ln2) < 1$.

3. The display panel in claim 2, wherein $In2/(In2+Ln2) \leq 0.95$.

4. The display panel in claim 1, wherein $0.01 \leq Ln2/(In2+Ln2) \leq 0.2$.

5. The display panel in claim 4, wherein the lower metal oxide layer further comprises a zinc oxide, a quantity of zinc atoms is $Zn1$ in the lower metal oxide layer, and $0.05 \leq Zn1/(In1+Ln1+Zn1) \leq 0.5$.

6. The display panel in claim 4, wherein the upper metal oxide layer further comprises a tin oxide, a quantity of tin atoms is $Sn$ in the upper metal oxide layer, and $Sn/(In2+Ln2+Sn) < Ln2/(In2+Ln2+Sn)$.

7. The display panel in claim 6, wherein $0.01 \leq Sn/(Sn+In2+Ln2) \leq 0.05$.

8. The display panel in claim 7, wherein the upper metal oxide layer further comprises a zinc oxide, a quantity of zinc atoms is Zn2 in the upper metal oxide layer, and $0.01 \leq Zn2/(Sn+In2+Ln2+Zn2) \leq 0.2$.

9. The display panel in claim 7, wherein the lower metal oxide layer is an amorphous metal oxide layer.

10. The display panel in claim 1, wherein a thickness of the lower metal oxide layer is great than or equal to 100 angstroms and is less than or equal to 200 angstroms, and a thickness of the upper metal oxide layer is great than or equal to 100 angstroms and is less than or equal to 200 angstroms.

11. A display panel, comprising:
a first substrate;
a gate electrode layer disposed on a surface of the first substrate, wherein the gate electrode layer comprises a gate electrode and a first connecting part arranged at intervals in a same layer;
a gate insulating layer covering the first substrate and the gate electrode layer;
a metal oxide layer disposed on the gate insulating layer and corresponding to the gate electrode; and
a source-drain electrode layer comprising a source electrode, a drain electrode, and a second connecting part arranged at intervals in a same layer, wherein the source electrode and the drain electrode are disposed on a surface of the metal oxide layer away from the gate electrode, the second connecting part is disposed on the gate insulating layer and corresponds to the first connecting part, and the second connecting part is in contact with the first connecting part through a first contact hole defined in the gate insulating layer;
wherein the metal oxide layer comprises:
a lower metal oxide layer comprising an indium oxide and a lanthanoid oxide; and
an upper metal oxide layer stacked on the lower metal oxide layer and located on a surface of the lower metal oxide layer adjacent to the source electrode and the drain electrode, wherein both the source electrode and the drain electrode are connected to the upper metal oxide layer, the upper metal oxide layer comprises an indium oxide and a lanthanoid oxide, and the metal oxide layer comprises polycrystalline phase;
wherein in the lower metal oxide layer, a quantity of indium atoms is In1, and a quantity of lanthanoid atoms is Ln1, and in the upper metal oxide layer, a quantity of the indium atoms is In2, and a quantity of the lanthanoid atoms is Ln2,
wherein $In2/(In2+Ln2) > In1/(In1+Ln1)$, $0.5 \leq In1/(In1+Ln1) \leq 0.9$.

12. The display panel in claim 11, further comprising:
a first passivation layer covering the source-drain electrode layer and the gate insulating layer;
a planarization layer covering the first passivation layer;
a common electrode disposed on the planarization layer;
a second passivation layer covering the common electrode and the planarization layer, wherein the second passivation layer defines with a second contact hole corresponding to the common electrode;
a third contact hole and a fourth contact hole going through the second passivation layer, the planarization layer, and the first passivation layer, wherein the third contact hole corresponds to the drain electrode, and the fourth contact hole corresponds to the second connecting part; and
a pixel electrode layer disposed on the second passivation layer, wherein the pixel electrode layer comprises a pixel electrode and a bridging part arranged at intervals in a same layer, the pixel electrode overlaps the drain electrode, the pixel electrode is in contact with the drain electrode through the third contact hole, the bridging part overlaps the common electrode and the second connecting part, the bridging part is in contact with the second connecting part through the fourth contact hole, and the bridging part is in contact with the common electrode through the second contact hole.

13. The display panel in claim 11, wherein $0.8 \leq In2/(In2+Ln2) < 1$.

14. The display panel in claim 13, wherein $In2/(In2+Ln2) \leq 0.95$.

15. The display panel in claim 11, wherein $0.01 \leq Ln2/(In2+Ln2) \leq 0.2$.

16. The display panel in claim 15, wherein the lower metal oxide layer further comprises a zinc oxide, a quantity of zinc atoms is Zn1 in the lower metal oxide layer, and $0.05 \leq Zn1/(In1+Ln1+Zn1) \leq 0.5$.

17. A display panel, comprising:
a thin film transistor comprising:
a gate electrode;
a source electrode and a drain electrode; and
a metal oxide layer disposed corresponding to the gate electrode, comprising:
a lower metal oxide layer comprising an indium oxide and a lanthanoid oxide; and
an upper metal oxide layer stacked on the lower metal oxide layer and located on a surface of the lower metal oxide layer adjacent to the source electrode and the drain electrode, wherein both the source electrode and the drain electrode are connected to the upper metal oxide layer, the upper metal oxide layer comprises a indium oxide and a lanthanoid oxide, and the upper metal oxide layer comprises polycrystalline phase;
wherein in the lower metal oxide layer, a quantity of indium atoms is In1, and a quantity of lanthanoid atoms is Ln1, and in the upper metal oxide layer, a quantity of indium atoms is In2, and a quantity of lanthanoid atoms is Ln2,
wherein $In2/(In2+Ln2) > In1/(In1+Ln1)$, $0.01 \leq Ln1/(In1+Ln1) \leq 0.5$.

* * * * *